(12) United States Patent
Lee (10) Patent No.: US 9,129,704 B2
(45) Date of Patent: Sep. 8, 2015

(54) SEMICONDUCTOR MEMORY DEVICES AND SEMICONDUCTOR SYSTEMS INCLUDING THE SAME

(71) Applicant: SK hynix Inc., Icheon-si, Gyeonggi-do (KR)

(72) Inventor: Sang Kwon Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 253 days.

(21) Appl. No.: 13/968,581

(22) Filed: Aug. 16, 2013

(65) Prior Publication Data

US 2014/0297986 A1 Oct. 2, 2014

(30) Foreign Application Priority Data

Apr. 2, 2013 (KR) .................. 10-2013-0035577

(51) Int. Cl.
*G06F 12/16* (2006.01)
*G11C 11/406* (2006.01)
*G11C 11/401* (2006.01)
*G06F 3/06* (2006.01)
*G11C 8/08* (2006.01)
*G11C 11/408* (2006.01)

(52) U.S. Cl.
CPC ........ *G11C 11/40618* (2013.01); *G06F 3/0614* (2013.01); *G06F 3/0619* (2013.01); *G11C 8/08* (2013.01); *G11C 11/401* (2013.01); *G11C 11/408* (2013.01); *G11C 11/40611* (2013.01)

(58) Field of Classification Search
CPC ............... G11C 8/08; G11C 11/40611; G11C 11/40618; G11C 11/408; G06F 3/0614; G06F 3/30619
See application file for complete search history.

(56) References Cited

U.S. PATENT DOCUMENTS

| 2013/0194868 A1* | 8/2013 | Hashimoto ............. 365/185.11 |
| 2015/0043293 A1* | 2/2015 | Song et al. .................... 365/222 |
| 2015/0085563 A1* | 3/2015 | Yoon ............................. 365/149 |

FOREIGN PATENT DOCUMENTS

| KR | 1020090126976 A | 12/2009 |
| KR | 1020120020315 A | 3/2012 |

* cited by examiner

*Primary Examiner* — John Lane
(74) *Attorney, Agent, or Firm* — William Park & Associates Ltd.

(57) ABSTRACT

The semiconductor memory device includes an internal flag signal generator and an active information generator. The internal flag signal generator generates a plurality of internal flag signals which are selectively enabled when combination signals of bank address signals and row address signals supplied are inputted from an external device at least a predetermined number of times. The active information generator outputs a flag signal enabled when at least one of the plurality of internal flag signals is enabled in response to a start signal for extracting information on a number of times that a word line is activated and outputs a plurality of bank information signals according to the plurality of internal flag signals. The active information generator generates internal bank address signals and internal row address signals according to the plurality of internal flag signals to refresh a bank.

20 Claims, 7 Drawing Sheets

SEMICONDUCTOR MEMORY DEVICES AND SEMICONDUCTOR SYSTEMS INCLUDING THE SAME

CROSS-REFERENCES TO RELATED APPLICATIONS

The present application claims priority under 35 U.S.C. 119(a) to Korean Application No. 10-2013-0035577, filed on Apr. 2, 2013, in the Korean Intellectual Property Office, which is incorporated herein by reference in its entirety as set forth in full.

BACKGROUND

Recently, low power dynamic random access memory (DRAM) devices have been increasingly in demand with the development of mobile products. In particular, the DRAM devices employed in the mobile products have been focused on reduction of current that flows during a refresh operation.

The DRAM devices among semiconductor memory devices may lose data stored in their memory cells as the time elapses even while their power supplies are applied thereto, in contrast to static random access memory (SRAM) devices or flash memory devices. In order to retain data, DRAM devices are basically accompanied with operations for rewriting the data from external systems in a period often called "refresh" operations. Usually, such a refresh operation is carried out, in retention times that are inherent in memory cells of banks, by activating word lines at least once or more, and sensing/amplifying data of the memory cells. The retention time is a time for which data can be maintained without a refresh operation after being written into a memory cell.

Figure 1:
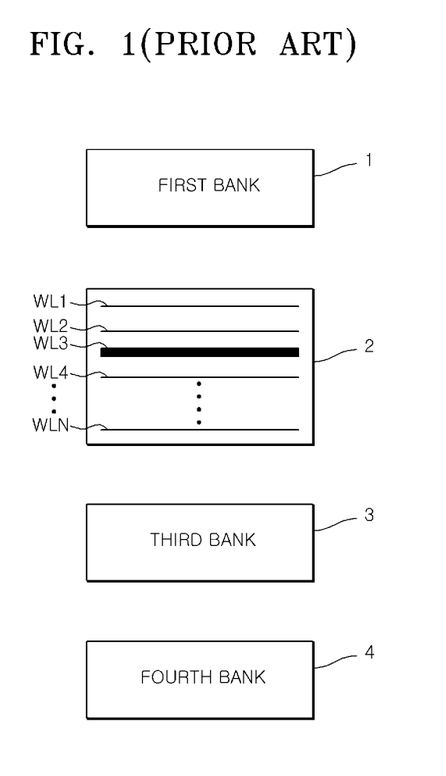
FIG. 1 is a block diagram illustrating a bank including word lines of the conventional semiconductor memory device.

FIG. 1 is a block diagram illustrating a bank including word lines of the conventional semiconductor memory device.

As illustrated in FIG. 1, the conventional semiconductor memory device includes first to fourth banks 1~4 and each of the first to fourth banks 1~4 has a plurality of word lines, for example, first to $N^{th}$ word lines WL1, Wl2, . . . and WLN which are electrically connected to memory cells.

When the third word line WL3 of the second bank 2 is repeatedly activated to be driven to a high voltage level VPP higher than a power supply voltage, the voltage levels of the second and fourth word lines WL2 and WL4 disposed to be immediately adjacent to the third word line WL3 may also be boosted. Thus, undesirable leakage currents may flows through the memory cells connected to the second and fourth word lines WL2 and WL4, and the data stored in the memory cells connected to the second and fourth word lines WL2 and WL4 may be lost within the data retention time. Accordingly, a refresh characteristic of the semiconductor memory device may be degraded.

SUMMARY

Various embodiments are directed to semiconductor memory devices and semiconductor systems including the same.

According to various embodiments, a semiconductor system includes a memory controller and a semiconductor memory device. The memory controller outputs a start signal for extracting information on a number of times that a word line is activated and a refresh signal for refreshing a bank in response to a flag signal which is enabled when the word line in the bank is activated by at least a predetermined number of times. The semiconductor memory device receives the start signal to output the flag signal and a plurality of bank information signals including information on the bank having the word line which is activated by at least the predetermined number of times. The semiconductor memory device also receives the refresh signal to refresh the bank including the word line.

According to various embodiments, a semiconductor system includes a memory controller and a semiconductor memory device. The memory controller outputs a start signal for extracting information on a number of times that a word line is activated and a refresh signal in response to a flag signal enabled when a word line in a bank is activated by at least a predetermined number of times. The semiconductor memory device receives the start signal to output the flag signal and a plurality of bank information signals including information on the bank. The semiconductor memory device also receives the refresh signal to activate a neighbor word line adjacent to the word line which is activated by at least the predetermined number of times.

According to various embodiments, a semiconductor memory device includes an internal flag signal generator and an active information generator. The internal flag signal generator generates a plurality of internal flag signals selectively enabled when combination signals of bank address signals and row address signals are inputted by from an external device at least a predetermined number of times. The active information generator outputs a flag signal enabled when at least one of the plurality of internal flag signals is enabled in response to a start signal for extracting information on a number of times that a word line is activated and outputs a plurality of bank information signals according the plurality of internal flag signals. The active information generator also generates internal bank address signals and internal row address signals according to the plurality of internal flag signals to refresh a bank.

In an embodiment, a system includes a memory controller configured to output a start signal to extract information on a word line which has been activated and a refresh signal in response to a flag signal which is enabled when the word line has been activated a predetermined number of times; and a semiconductor memory device configured to receive the start signal to output the flag signal and bank information signals and receive the refresh signal to refresh a bank that includes the word line which has been activated.

In an embodiment, the semiconductor memory device includes an internal flag signal generator configured to generate internal flag signals when bank address signals and row address signals are inputted a predetermined number of times by an external device; and an active information generator configured to output the flag signal in response to one or more internal flag signals being enabled and generate bank information signals according to the internal flag signals.

In an embodiment, wherein the bank information signals includes location information of the bank having the word line which has been activated the predetermined number of times.

In an embodiment, wherein the active information generator is configured to output internal bank address signals and internal row address signals to the bank having the word line activated by the predetermined number of times.

In an embodiment, wherein the bank is refreshed by activating an other word line according to a combination of the internal bank address signals and the internal row address signals.

In an embodiment, wherein the active information generator includes a detector configured to generate the flag signal when the at least one or more internal flag signals are enabled;

and a bank information signal generator configured to generate the bank information signals according to the one or more internal flag signals.

In an embodiment, wherein the active information generator further comprises an internal address generator configured to output the bank information signals as the internal bank address signals and output the internal row address signals, wherein a combination of the internal bank address signals and the internal row address signals refresh the bank.

In an embodiment, a memory system includes a memory controller and a semiconductor memory device. The semiconductor memory device comprises: an internal flag signal generator configured to generate a plurality of internal flag signals selectively enabled when combination signals of bank address signals and row address signals are inputted a predetermined number of times from an external device; and an active information generator configured to output a flag signal enabled when at least one of the plurality of internal flag signals is enabled in response to a start signal for extracting information on a number of times that a word line is activated and output a plurality of bank information signals according to the plurality of internal flag signals, wherein the active information generator is configured to generate internal bank address signals and internal row address signals according to the plurality of internal flag signals to refresh a bank.

In an embodiment, an electronic device includes a memory system communicatively coupled to a central processing unit. The memory system includes a semiconductor memory device. The semiconductor memory device comprises: an internal flag signal generator configured to generate a plurality of internal flag signals selectively enabled when combination signals of bank address signals and row address signals are inputted a predetermined number of times from an external device; and an active information generator configured to output a flag signal enabled when at least one of the plurality of internal flag signals is enabled in response to a start signal for extracting information on a number of times that a word line is activated and output a plurality of bank information signals according to the plurality of internal flag signals, wherein the active information generator is configured to generate internal bank address signals and internal row address signals according to the plurality of internal flag signals to refresh a bank.

BRIEF DESCRIPTION OF THE DRAWINGS

Embodiments in accordance with the present invention will become more apparent in view of the attached drawings and accompanying detailed description, in which.

DETAILED DESCRIPTION

Various embodiments of the inventive concept will be described hereinafter with reference to the accompanying drawings. However, the various embodiments described herein are for illustrative purposes only and are not intended to limit the scope of the inventive concept.

Figure 2:
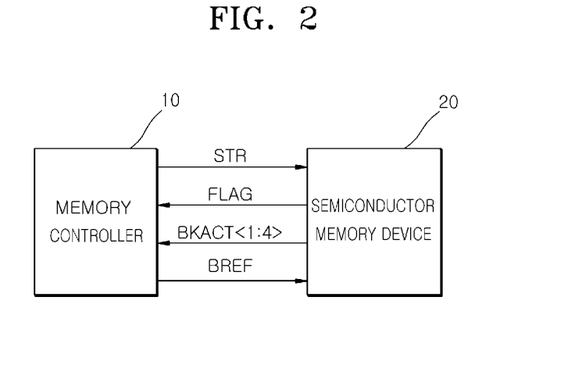
FIG. 2 is a block diagram illustrating a configuration of a semiconductor system according to various embodiments.

As illustrated in FIG. 2, a semiconductor system according to an embodiment may be configured to include a memory controller 10 and a semiconductor memory device 20.

The memory controller 10 may output a start signal STR for extracting information on the number of times that word lines in the semiconductor memory device 20 are activated and may output a refresh signal BREF for refreshing a bank (23 of FIG. 3) in the semiconductor memory device 20 in response to a flag signal FLAG which is enabled when the number of times that the word lines in the bank (23 of FIG. 3) of the semiconductor memory device 20 are activated is equal to or greater than a predetermined number. The start signal STR may be set as a mode register read command for outputting set information such as a burst type, a burst length (BL) and a column address strobe latency (CAS latency or CL) which are stored in a mode register set.

The semiconductor memory device 20 may receive the start signal STR to output the flag signal FLAG and bank information signals BKACT<1:4> including location information of the bank 23 having the word lines which are repeatedly activated by at least the predetermined number of times and may receive the refresh signal BREF to refresh the bank 23 including the word lines which are repeatedly activated by at least the predetermined number of times.

A configuration of the semiconductor memory device 20 will be described more fully hereinafter with reference to FIG. 3.

Figure 3:
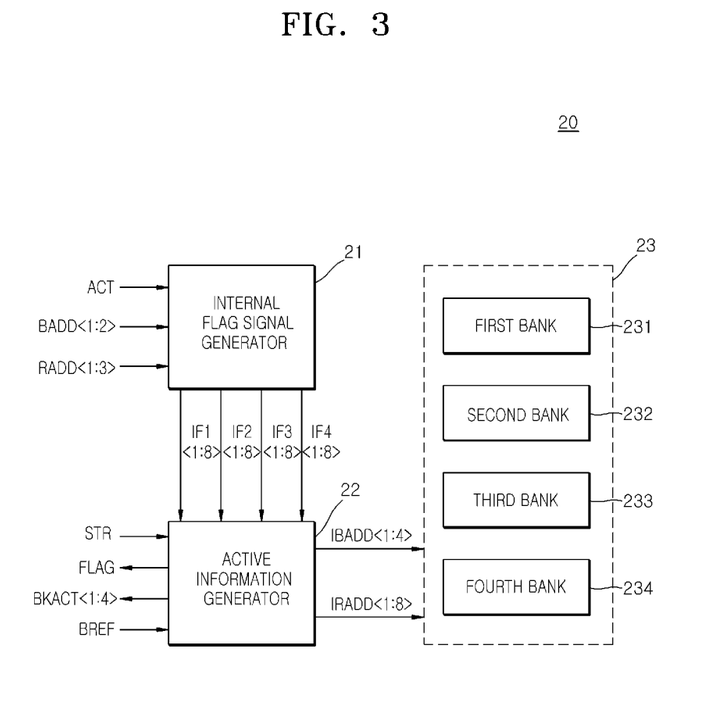
FIG. 3 is a block diagram illustrating a configuration of a semiconductor memory device included in the semiconductor system shown in FIG. 2.

Referring to FIG. 3, the semiconductor memory device 20 may be configured to include an internal flag signal generator 21, an active information generator 22, and the bank 23 having first to fourth banks 231~234.

The internal flag signal generator 21 may receive an active command signal ACT to generate first to thirty-second internal flag signals IF1<1:8>, IF2<1:8>, IF3<1:8> and IF4<1:8> which are selectively enabled when a combination signal of bank address signals BADD<1:2> and row address signals RADD<1:3> is inputted by at least a predetermined number of times. The first to eighth internal flag signals IF1<1:8> may include location information of the word lines which are activated by at least the predetermined number of times in the first bank 231, and the ninth to sixteenth internal flag signals IF2<1:8> may include location information of the word lines which are activated by at least the predetermined number of times in the second bank 232. Further, the seventeenth to twenty-fourth internal flag signals IF3<1:8> may include location information of the word lines which are activated by at least the predetermined number of times in the third bank 233, and the twenty-fifth to thirty-second internal flag signals IF4<1:8> may include location information of the word lines which are activated by at least the predetermined number of times in the fourth bank 234. In various embodiments, the internal flag signal generator 21 may be realized such that at least two among the first to thirty-second internal flag signals IF1<1:8>, IF2<1:8>, IF3<1:8> and IF4<1:8> are enabled.

The active information generator 22 may receive the start signal STR to output the flag signal FLAG which is enabled when at least one of the first to thirty-second internal flag signals IF1<1:8>, IF2<1:8>, IF3<1:8> and IF4<1:8> is enabled and may generate the first to fourth bank information signals BKACT<1:4> according to a combination of the first to thirty-second internal flag signals IF1<1:8>, IF2<1:8>, IF3<1:8> and IF4<1:8>. The first to fourth bank information signals BKACT<1:4> may include location information of the bank 23 having the word lines which are activated by at least the predetermined number of times. Further, the active information generator 22 may receive the refresh signal BREF to output the first to fourth bank information signals BKACT<1:4> as first to fourth internal bank address signals IBADD<1:4>, to output first to eighth internal row address signals IRADD<1:8> that are sequentially counted, and to output the first to fourth bank information signals BKACT<1:4> as first to fourth count termination signals (CNT_END<1:4> of FIG. 4

The first to fourth banks 231~234 included in the bank 23 may be refreshed by activating the word lines according to a combination of the first to fourth internal bank address signals IBADD<1:4> and the first to eighth internal row address signals IRADD<1:8>.

A configuration of the internal flag signal generator 21 will be described more fully hereinafter with reference to FIG. 4.

Figure 4:
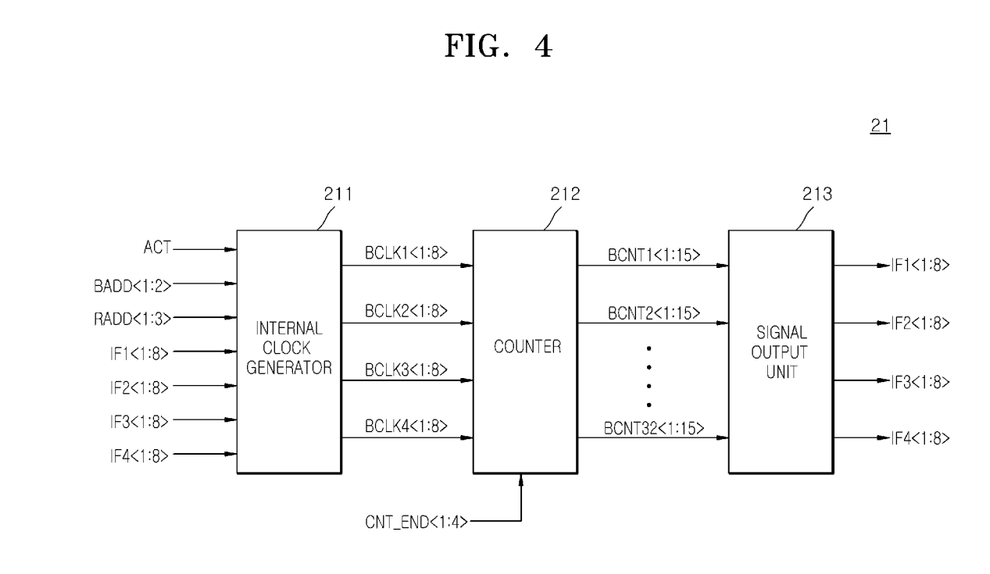
FIG. 4 is a block diagram illustrating a configuration of an internal flag signal generator included in the semiconductor memory device shown in FIG. 3.

Referring to FIG. 4, the internal flag signal generator 21 may configured to include an internal clock generator 211, a counter 212 and a signal output unit 213.

The internal clock generator 211 may receive the active command signal ACT to generate first to thirty-second internal clock signals BCLK1<1:8>, BCLK2<1:8>, BCLK3<1:8> and BCLK4<1:8> which are selectively toggled according to a combination of the bank address signals BADD<1:2> and the row address signals RADD<1:3>. Further, the internal clock generator 211 may be configured such that the first to eighth internal clock signals BCLK1<1:8> are not toggled when one of the first to eighth internal flag signals IF1<1:8> is enabled; the ninth to sixteenth internal clock signals BCLK2<1:8> are not toggled when one of the ninth to sixteenth internal flag signals IF2<1:8> is enabled; the seventeenth to twenty-fourth internal clock signals BCLK3<1:8> are not toggled when one of the seventeenth to twenty-fourth internal flag signals IF3<1:8> is enabled; and the twenty-fifth to thirty-second internal clock signals BCLK4<1:8> are not toggled when one of the twenty-fifth to thirty-second internal flag signals IF4<1:8> is enabled.

The counter 212 may output first to thirty-second count signals BCNT1<1:15>~BCNT32<1:15> that are counted when the first to thirty-second BCLK1<1:8>, BCLK2<1:8>, BCLK3<1:8> and BCLK4<1:8> are toggled. Each of the first to thirty-second count signals BCNT1<1:15>~BCNT32<1:15> may be set to have 15 bits. In such a case, the predetermined number of times that the word lines are activated may be fifteen. However, the number of bits of each of the first to thirty-second count signals BCNT1<1:15>~BCNT32<1:15> may not be limited to 15. That is, the predetermined number of times that the word lines are activated may be set to be less or greater than 15 by varying the number of bits of each of the first to thirty-second count signals BCNT1<1:15>~BCNT32<1:15>. Further, the counter 212 may not count the first to thirty-second count signals BCNT1<1:15>~BCNT32<1:15> when the first to fourth count termination signals CNT_END<1:4> are enabled. That is, the counter 212 may generate the first to eighth count signals BCNT1<1:15>~BCNT8<1:15> having a logic "low" level when the first count termination signal CNT_END<1> is enabled; may generate the ninth to sixteenth count signals BCNT9<1:15>~BCNT16<1:15> having a logic "low" level when the second count termination signal CNT_END<2> is enabled; may generate the seventeenth to twenty-fourth count signals BCNT17<1:15>~BCNT24<1:15> having a logic "low" level when the third count termination signal CNT_END<3> is enabled; and may generate the twenty-fifth to thirty-second count signals BCNT25<1:15>~BCNT32<1:15> having a logic "low" level when the fourth count termination signal CNT_END<4> is enabled.

The signal output unit 213 may generate the first to thirty-second internal flag signals IF1<1:8>, IF2<1:8>, IF3<1:8> and IF4<1:8> which are selectively enabled when all bits of the first to thirty-second count signals BCNT25<1:15>~BCNT32<1:15> are counted.

A configuration of the active information generator 22 will be described more fully hereinafter with reference to FIG. 5.

Figure 5:
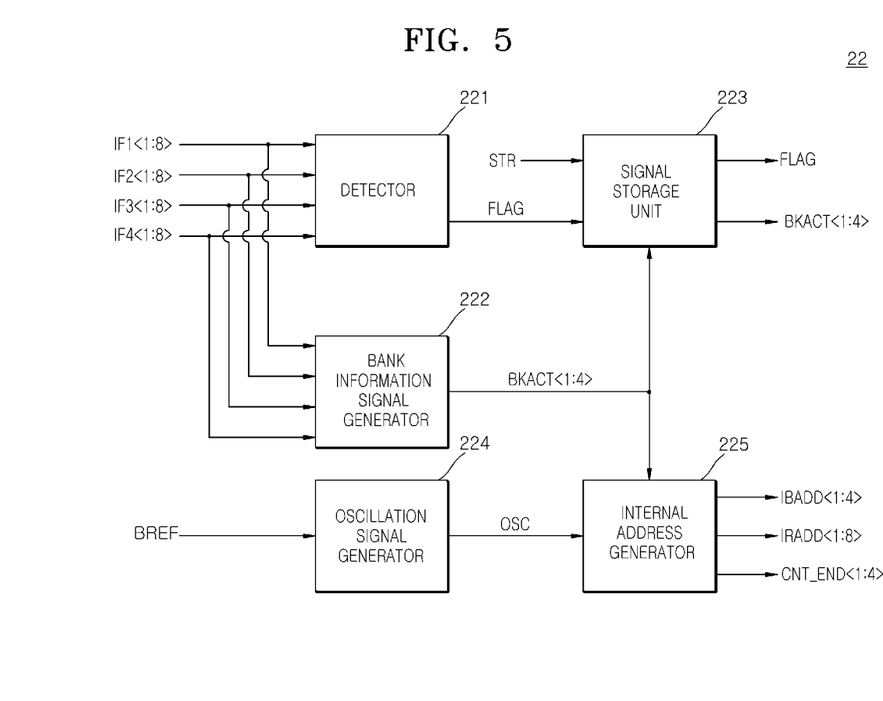
FIG. 5 is a block diagram illustrating an example of an active information generator included in the semiconductor memory device shown in FIG. 3.

Referring to FIG. 5, the active information generator 22 may be configured to include a detector 221, a bank information signal generator 222, a signal storage unit 223, an oscillation signal generator 224 and an internal address generator 225.

The detector 221 may generate the flag signal FLAG which is enabled to have a logic "high" level when at least one of the first to thirty-second internal flag signals IF1<1:8>, IF2<1:8>, IF3<1:8> and IF4<1:8> is enabled.

The bank information signal generator 222 may generate the first to fourth bank information signals BKACT<1:4> according to a combination of the first to thirty-second internal flag signals IF1<1:8>, IF2<1:8>, IF3<1:8> and IF4<1:8>. That is, the bank information signal generator 222 may generate the first bank information signal BKACT<1> which is enabled to have a logic "high" level when one of the first to eighth internal flag signals IF1<1:8> is enabled; may generate the second bank information signal BKACT<2> which is enabled to have a logic "high" level when one of the ninth to sixteenth internal flag signals IF2<1:8> is enabled; may generate the third bank information signal BKACT<3> which is enabled to have a logic "high" level when one of the seventeenth to twenty-fourth internal flag signals IF3<1:8> is enabled; and may generate the fourth bank information signal BKACT<4> which is enabled to have a logic "high" level when one of the twenty-fifth to thirty-second internal flag signals IF4<1:8> is enabled.

The signal storage unit 223 may store the flag signal FLAG and the first to fourth bank information signals BKACT<1:4> therein and may output the flag signal FLAG and the first to fourth bank information signals BKACT<1:4> in response to the start signal STR.

The oscillation signal generator 224 may receive the refresh signal BREF to generate an oscillation signal OSC including pulses which are periodically created. In various embodiments, a frequency of the oscillation signal OSC (i.e., the number of the pulses created in a unit time) may be set to be equal to the bit number of the internal row address signals IRADD<1:8>.

The internal address generator 225 may output the first to fourth bank information signals BKACT<1:4> as the first to fourth internal bank address signals IBADD<1:4> and may output the first to eighth internal row address signals IRADD<1:8> that are sequentially counted in response to the oscillation signal OSC. Further, the internal address generator 225 may output the first to fourth bank information signals BKACT<1:4> as the first to fourth count termination signals CNT_END<1:4> when all bits of the first to eighth internal row address signals IRADD<1:8> are counted.

Hereinafter, an operation of the semiconductor system as set forth above will be described in conjunction with an example that a second word line of the second bank 232 is activated by at least the predetermined number of times (e.g., 15 times) according to a combination of the bank address signals BADD<1:2> and the row address signals RADD<1:3>.

The internal clock generator 211 of the internal flag signal generator 21 may receive the active command signal ACT to toggle the tenth internal clock signal BCLK2<2> of the first to thirty-second internal clock signals BCLK1<1:8>, BCLK2<1:8>, BCLK3<1:8> and BCLK4<1:8> by 15 times according to a combination of the bank address signals BADD<1:2> and the row address signals RADD<1:3>. In such a case, the first to ninth internal clock signals BCLK1<1:8> and BCLK2<1> and the eleventh to thirty-second internal clock signals BCLK2<3:8>, BCLK3<1:8> and BCLK4<1:8> may be toggled by 14 times or less according to a combination of the bank address signals BADD<1:2> and the row address signals RADD<1:3>.

The counter 212 may count all bits of the tenth count signals BCNT10<1:15> of the first to thirty-second count signals BCNT1<1:15>~BCNT32<1:15> because the tenth internal clock signal BCLK2<2> of the first to thirty-second internal clock signals BCLK1<1:8>, BCLK2<1:8>, BCLK3<1:8> and BCLK4<1:8> is toggled by 15 times. In such a case, the counter 212 may count the first to ninth count signals BCNT1<1:15>~BCNT9<1:15> and the eleventh to thirty-second count signals BCNT11<1:15>~BCNT32<1:15> by the same number of times that the first to ninth internal clock signals BCLK1<1:8> and BCLK2<1> and the eleventh to thirty-second internal clock signals BCLK2<3:8>, BCLK3<1:8> and BCLK4<1:8> are toggled.

The signal output unit 213 may generate the tenth internal flag signal IF2<2> enabled to have a logic "high" level because all bits of the tenth count signals BCNT10<1:15> are counted.

The detector 221 may generate the flag signal FLAG which is enabled to have a logic "high" level because the tenth internal flag signal IF2<2> of the first to thirty-second internal flag signals IF1<1:8>, IF2<1:8>, IF3<1:8> and IF4<1:8> is enabled.

The bank information signal generator 222 may generate the second bank information signal BKACT<2> of the first to fourth bank information signals BKACT<1:4>, which is enabled to have a logic "high" level, because the tenth internal flag signal IF2<2> of the first to thirty-second internal flag signals IF1<1:8>, IF2<1:8>, IF3<1:8> and IF4<1:8> is enabled.

The signal storage unit 223 may store the flag signal FLAG and the first to fourth bank information signals BKACT<1:4> therein and may output the flag signal FLAG and the first to fourth bank information signals BKACT<1:4> in response to the start signal STR.

The memory controller 10 may output the refresh signal BREF in response to the flag signal FLAG enabled to have a logic "high" level.

The oscillation signal generator 224 may receive the refresh signal BREF to generate the oscillation signal OSC including pulses which are periodically created.

The internal address generator 225 may output the first to fourth bank information signals BKACT<1:4> as the first to fourth internal bank address signals IBADD<1:4> and may output the first to eighth internal row address signals IRADD<1:8> that are sequentially counted in response to the oscillation signal OSC. Further, the internal address generator 225 may output the first to fourth bank information signals BKACT<1:4> as the first to fourth count termination signals CNT_END<1:4>.

All word lines of the second bank 232 may be sequentially activated according to a combination of the first to fourth internal bank address signals IBADD<1:4> and the first to eighth internal row address signals IRADD<1:8>. That is, the second bank 232 may be refreshed.

The semiconductor system as set forth above may refresh the bank including word lines that are activated by at least the predetermined number of times, thereby securing the retention time of the memory cells therein and preventing the degradation of a refresh characteristic thereof.

Figure 6:
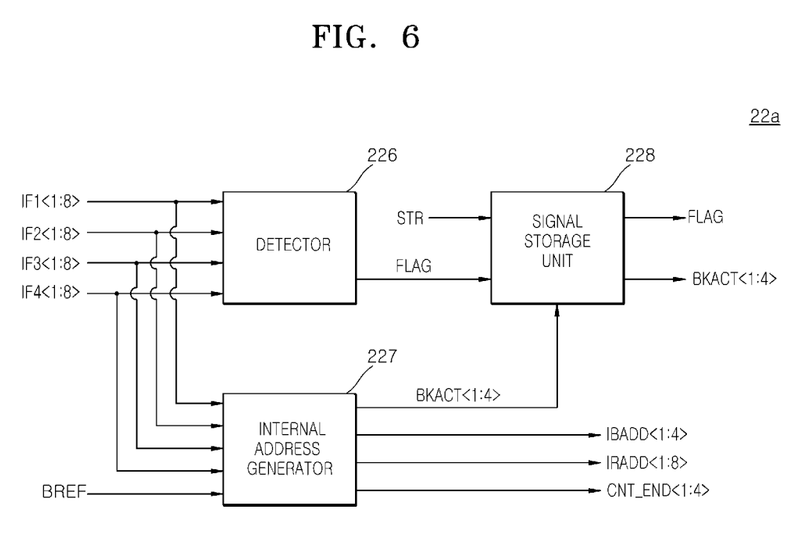
FIG. 6 is a block diagram illustrating an example of an active information generator included in the semiconductor memory device shown in FIG. 3.

FIG. 6 is a block diagram illustrating an example of an active information generator included in the semiconductor memory device shown in FIG. 3

Referring to FIG. 6, an active information generator 22a may be configured to include a detector 226, an internal address generator 227 and a signal storage unit 228.

The detector 226 may generate the flag signal FLAG which is enabled to have a logic "high" level when at least one of the first to thirty-second internal flag signals IF1<1:8>, IF2<1:8>, IF3<1:8> and IF4<1:8> is enabled.

The internal address generator 227 may generate the first to fourth bank information signals BKACT<1:4> according to a combination of the first to thirty-second internal flag signals IF1<1:8>, IF2<1:8>, IF3<1:8> and IF4<1:8>. That is, the internal address generator 227 may generate the first bank information signal BKACT<1> which is enabled to have a logic "high" level when one of the first to eighth internal flag signals IF1<1:8> is enabled; may generate the second bank information signal BKACT<2> which is enabled to have a logic "high" level when one of the ninth to sixteenth internal flag signals IF2<1:8> is enabled; may generate the third bank information signal BKACT<3> which is enabled to have a logic "high" level when one of the seventeenth to twenty-fourth internal flag signals IF3<1:8> is enabled; and may generate the fourth bank information signal BKACT<4> which is enabled to have a logic "high" level when one of the twenty-fifth to thirty-second internal flag signals IF4<1:8> is enabled. In addition, the internal address generator 227 may receive the refresh signal BREF to output the first to fourth bank information signals BKACT<1:4> as the first to fourth internal bank address signals IBADD<1:4>; and may generate the first to eighth internal row address signals IRADD<1:8> for activating neighbor word lines immediately adjacent to a word line which is activated by at least the predetermined number of times according to a combination of the first to thirty-second internal flag signals IF1<1:8>, IF2<1:8>, IF3<1:8> and IF4<1:8>. Moreover, the internal address generator 227 may output the first to fourth bank information signals BKACT<1:4> as the first to fourth count termination signals CNT_END<1:4>.

The signal storage unit 228 may store the flag signal FLAG and the first to fourth bank information signals BKACT<1:4> therein and may output the flag signal FLAG and the first to fourth bank information signals BKACT<1:4> in response to the start signal STR.

Hereinafter, an operation of the semiconductor system including the active information generator 22a as set forth above will be described in conjunction with an example that a second word line of the second bank 232 is activated by at least the predetermined number of times (e.g., 15 times) according to a combination of the bank address signals BADD<1:2> and the row address signals RADD<1:3>.

The internal clock generator 211 of the internal flag signal generator 21 may receive the active command signal ACT to toggle the tenth internal clock signal BCLK2<2> of the first to thirty-second internal clock signals BCLK1<1:8>, BCLK2<1:8>, BCLK3<1:8> and BCLK4<1:8> by 15 times according to a combination of the bank address signals BADD<1:2> and the row address signals RADD<1:3>. In such a case, the first to ninth internal clock signals BCLK1<1:8> and BCLK2<1> and the eleventh to thirty-second internal clock signals BCLK2<3:8>, BCLK3<1:8> and BCLK4<1:8> may be toggled by 14 times or less according to a combination of the bank address signals BADD<1:2> and the row address signals RADD<1:3>.

The counter 212 may count all bits of the tenth count signals BCNT10<1:15> of the first to thirty-second count signals BCNT1<1:15>~BCNT32<1:15> because the tenth internal clock signal BCLK2<2> of the first to thirty-second internal clock signals BCLK1<1:8>, BCLK2<1:8>, BCLK3<1:8> and BCLK4<1:8> is toggled by 15 times. In such a case, the counter 212 may count the first to ninth count signals BCNT1<1:15>~BCNT9<1:15> and the eleventh to thirty-second count signals BCNT11<1:15>~BCNT32<1:15> by the same number of times that the first to ninth internal clock signals BCLK1<1:8> and BCLK2<1> and the eleventh to thirty-second internal clock signals BCLK2<3:8>, BCLK3<1:8> and BCLK4<1:8> are toggled.

The signal output unit 213 may generate the tenth internal flag signal IF2<2> enabled to have a logic "high" level because all bits of the tenth count signals BCNT10<1:15> are counted.

The detector 226 may generate the flag signal FLAG which is enabled to have a logic "high" level because the tenth internal flag signal IF2<2> of the first to thirty-second internal flag signals IF1<1:8>, IF2<1:8>, IF3<1:8> and IF4<1:8> is enabled.

The internal address generator 227 may generate the second bank information signal BKACT<2> of the first to fourth bank information signals BKACT<1:4>, which is enabled to have a logic "high" level, because the tenth internal flag signal IF2<2> of the first to thirty-second internal flag signals IF1<1:8>, IF2<1:8>, IF3<1:8> and IF4<1:8> is enabled.

The signal storage unit 228 may store the flag signal FLAG and the first to fourth bank information signals BKACT<1:4> therein and may output the flag signal FLAG and the first to fourth bank information signals BKACT<1:4> in response to the start signal STR.

The memory controller 10 may output the refresh signal BREF in response to the flag signal FLAG enabled to have a logic "high" level.

The internal address generator 227 may receive the refresh signal BREF to output the first to fourth bank information signals BKACT<1:4> as the first to fourth internal bank address signals IBADD<1:4> and to generate the first and third internal bank address signals IBADD<1> and IBADD<3> having a logic "high" level. Moreover, the internal address generator 227 may output the first to fourth bank information signals BKACT<1:4> as the first to fourth count termination signals CNT_END<1:4>.

A first word line and a third word line immediately adjacent to the second word line in the second bank 232 may be activated according to a combination of the first to fourth internal bank address signals IBADD<1:4> and the first to eighth internal row address signals IRADD<1:8>.

The semiconductor system as set forth above may activate neighbor word lines immediately adjacent to a word line that is activated by at least the predetermined number of times, thereby securing the retention time of the memory cells therein and preventing the degradation of a refresh characteristic thereof.

Figure 7:
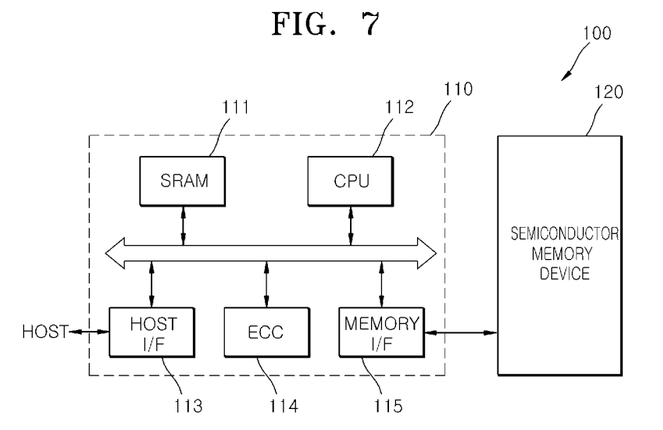
FIG. 7 is a block diagram illustrating a memory system according to an embodiment of the present invention.

FIG. 7 is a block diagram illustrating a memory system according to an embodiment of the present invention.

In FIG. 7, the memory system 100 of an embodiment may include a semiconductor memory device 120, a memory controller 110, and a CPU 112.

The semiconductor memory device 120 may serve as a volatile memory device such as a DRAM. The memory controller 110 may control the semiconductor memory device 120, and may include an SRAM 111, a host interface 113, an Error Code Correction Block (ECC) 114, and a memory interface 115. The SRAM 111 may be used as an operation memory of the CPU 112. The CPU 112 may perform control operation for data exchange of the memory controller 110, and the host interface 113 may have data exchange protocol of a host accessed to the memory system 100. The ECC 114 may detect and correct error of data read from the semiconductor memory device 120, and the memory interface 114 may interface with the semiconductor memory device 120. The memory controller 110 may include further ROM for storing data for interfacing with the host, etc.

Figure 8:
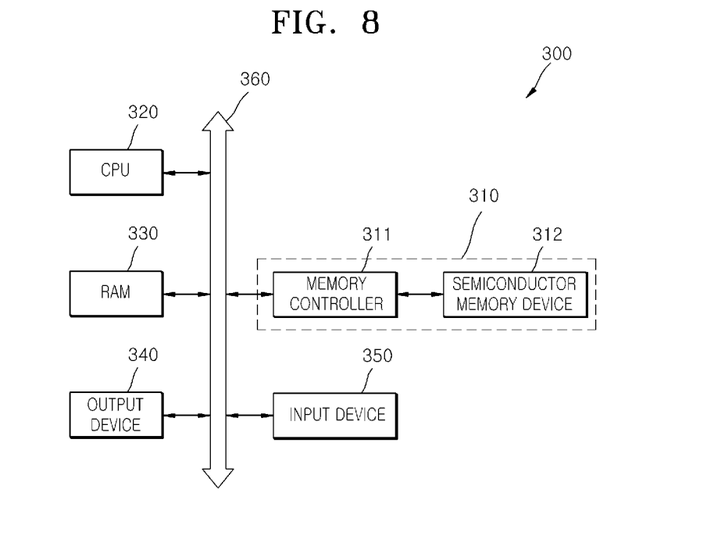
FIG. 8 is a block diagram illustrating an electronic device according to an embodiment of the present invention.

FIG. 8 is a view illustrating an electronic device or a computing system according to an embodiment of the present invention.

In FIG. 8, the computing system 300 of various embodiments of the present invention may include a CPU 320 connected to a system bus 360, a RAM 330, an output device or a user interface 340, an input device 350, and a memory system 310 including a memory controller 311 and a semiconductor memory device 312. In case that the computing system 300 is a mobile device, a battery (not shown) for supplying an operation voltage to the computing system 300 may be provided. The computing system 300 of the present invention may further include an application chipset, a complementary metal-oxide semiconductor (CMOS) image processor CIS, a mobile DRAM, etc.

The output device or user interface 340 may be a self-contained display in the case of a portable electronic device. The input device 350 may be a physical keyboard or a virtual keyboard in the case of a portable electronic device such as i.e. a smartphone, tablet, pc, labtop, etc. The portable electronic device may further include, without limitation, a trackball, touchpad, or other cursor control device combined with a selection control, such as a pushbutton, to select an item highlighted by cursor manipulation. The memory system 310 may include a semiconductor memory device as described in FIG. 7.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A system comprising:
    a memory controller configured to output a start signal for extracting information on a number of times that a word line is activated and output a refresh signal for refreshing a bank in response to a flag signal which is enabled when the word line in the bank is activated by at least a predetermined number of times; and
    a semiconductor memory device configured to receive the start signal to output the flag signal and a plurality of bank information signals including information on the bank having the word line activated by at least the predetermined number of times and configured to receive the refresh signal to refresh the bank including the word line.

2. The system of claim 1, wherein the semiconductor memory device includes:
  an internal flag signal generator configured to generate a plurality of internal flag signals which are selectively enabled when combination signals of bank address signals and row address signals supplied by an external device are inputted by at least the predetermined number of times; and
  an active information generator configured to receive the start signal to output the flag signal which is enabled when at least one of the plurality of internal flag signals is enabled and configured to output the plurality of bank information signals according to a combination of the plurality of internal flag signals,
  wherein the active information generator is configured to generate internal bank address signals and internal row address signals according to the plurality of internal flag signals to refresh the bank.

3. The system of claim 2, wherein the plurality of internal flag signals include location information on the word line that is activated by at least the predetermined number of times according to a combination of the bank address signals and the row address signals.

4. The system of claim 2, wherein the internal flag signal generator includes:
  an internal clock generator configured to receive an active command signal to generate a plurality of internal clock signals which are selectively toggled according to a combination of the bank address signals and the row address signals, and configured not to toggle the plurality of internal clock signals when the plurality of internal flag signals are enabled;
  a counter configured to generate a plurality of count signals that are sequentially counted when the plurality of internal clock signals are toggled; and
  a signal output unit configured to generate the plurality of internal flag signals which are selectively enabled when all bits of the plurality of count signals are counted.

5. The system of claim 4, wherein the predetermined number of times that the word line is activated is set to the number of bits of each of the plurality of count signals.

6. The system of claim 4, wherein the active information generator includes:
  a detector configured to generate the flag signal which is enabled when at least one of the plurality of internal flag signals is enabled;
  a bank information signal generator configured to generate the plurality of bank information signals according to a combination of the plurality of internal flag signals;
  a signal storage unit configured to store the flag signal and the plurality of bank information signals therein and configured to output the flag signal and the plurality of bank information signals in response to the start signal;
  an oscillation signal generator configured to receive the refresh signal to generate an oscillation signal which is periodically enabled; and
  an internal address generator configured to output the plurality of bank information signals as the plurality of internal bank address signals and configured to output the plurality of internal row address signals that are sequentially counted in response to the oscillation signal,
  wherein the internal address generator outputs the plurality of bank information signals as a plurality of count termination signals when all the internal row address signals are counted.

7. The system of claim 6, wherein the counter does not count the plurality of count signals when the plurality of count termination signals are enabled.

8. A semiconductor system comprising:
  a memory controller configured to output a start signal for extracting information on a number of times that a word line is activated and output a refresh signal in response to a flag signal enabled when the word line in a bank is activated by at least a predetermined number of times; and
  a semiconductor memory device configured to receive the start signal to output the flag signal and a plurality of bank information signals including information on the bank receive the refresh signal to activate a neighbor word line adjacent to the word line activated by at least the predetermined number of times.

9. The semiconductor system of claim 8, wherein the semiconductor memory device includes:
  an internal flag signal generator configured to generate a plurality of internal flag signals which are selectively enabled when combination signals of bank address signals and row address signals supplied by an external device are inputted by at least the predetermined number of times; and
  an active information generator configured to receive the start signal to output the flag signal which is enabled when at least one of the plurality of internal flag signals is enabled and configured to output the plurality of bank information signals according to a combination of the plurality of internal flag signals,
  wherein the active information generator is configured to generate internal bank address signals and internal row address signals according to the plurality of internal flag signals to activate the neighbor word line adjacent to the word line which is activated by at least the predetermined number of times.

10. The semiconductor system of claim 9, wherein the plurality of internal flag signals include location information on the word line that is activated by at least the predetermined number of times according to a combination of the bank address signals and the row address signals.

11. The semiconductor system of claim 9, wherein the internal flag signal generator includes:
  an internal clock generator configured to receive an active command signal to generate a plurality of internal clock signals which are selectively toggled according to a combination of the bank address signals and the row address signals, and configured not to toggle the plurality of internal clock signals when the plurality of internal flag signals are enabled;
  a counter configured to generate a plurality of count signals that are sequentially counted when the plurality of internal clock signals are toggled; and
  a signal output unit configured to generate the plurality of internal flag signals which are selectively enabled when all bits of the plurality of count signals are counted.

12. The semiconductor system of claim 11, wherein the predetermined number of times that the word line is activated is set to the number of bits of each of the plurality of count signals.

13. The semiconductor system of claim 11, wherein the active information generator includes:
  a detector configured to generate the flag signal which is enabled when at least one of the plurality of internal flag signals is enabled;
  an internal address generator configured to generate the plurality of bank information signals according to a combination of the plurality of internal flag signals, configured to output the plurality of bank information signals as the plurality of internal bank address signals in response to the refresh signal, configured to receive the refresh signal to generate the plurality of internal row address signals for activating the neighbor word line adjacent to the word line which is activated by at least the predetermined number of times, and configured to output the plurality of bank information signals as a plurality of count termination signals when the plurality of internal row address signals are generated; and a signal storage unit configured to store the flag signal and the plurality of bank information signals therein and configured to output the flag signal and the plurality of bank information signals in response to the start signal.

14. The semiconductor system of claim 13, wherein the counter does not count the plurality of count signals when the plurality of count termination signals are enabled.

15. A semiconductor memory device comprising:

an internal flag signal generator configured to generate a plurality of internal flag signals selectively enabled when combination signals of bank address signals and row address signals are inputted a predetermined number of times from an external device; and an active information generator configured to output a flag signal enabled when at least one of the plurality of internal flag signals is enabled in response to a start signal for extracting information on a number of times that a word line is activated and output a plurality of bank information signals according to the plurality of internal flag signals, wherein the active information generator is configured to generate internal bank address signals and internal row address signals according to the plurality of internal flag signals to refresh a bank.

16. The semiconductor memory device of claim 15, wherein the plurality of internal flag signals include location information on a word line that is activated by at least the predetermined number of times according to a combination of the bank address signals and the row address signals.

17. The semiconductor memory device of claim 15, wherein the internal flag signal generator includes:

an internal clock generator configured to receive an active command signal to generate a plurality of internal clock signals which are selectively toggled according to a combination of the bank address signals and the row address signals, and configured not to toggle the plurality of internal clock signals when the plurality of internal flag signals are enabled;

a counter configured to generate a plurality of count signals that are sequentially counted when the plurality of internal clock signals are toggled; and a signal output unit configured to generate the plurality of internal flag signals which are selectively enabled when all bits of the plurality of count signals are counted.

18. The semiconductor memory device of claim 17, wherein the predetermined number of times that the word line is activated is set to the number of bits of each of the plurality of count signals.

19. The semiconductor memory device of claim 15, wherein the active information generator includes:

a detector configured to generate the flag signal which is enabled when at least one of the plurality of internal flag signals is enabled;

a bank information signal generator configured to generate the plurality of bank information signals according to a combination of the plurality of internal flag signals;

a signal storage unit configured to store the flag signal and the plurality of bank information signals therein and configured to output the flag signal and the plurality of bank information signals in response to the start signal;

an oscillation signal generator configured to receive a refresh signal to generate an oscillation signal which is periodically enabled; and an internal address generator configured to output the plurality of bank information signals as the plurality of internal bank address signals and configured to output the plurality of internal row address signals that are sequentially counted in response to the oscillation signal, wherein the internal address generator outputs the plurality of bank information signals as a plurality of count termination signals when all the internal row address signals are counted.

20. The semiconductor memory device of claim 19, wherein the counter does not count the plurality of count signals when the plurality of count termination signals are enabled.

* * * * *